United States Patent
Maeda

(10) Patent No.: US 10,656,541 B2
(45) Date of Patent: May 19, 2020

(54) MEASUREMENT APPARATUS, EXPOSURE APPARATUS, AND METHOD OF MANUFACTURING ARTICLE

(71) Applicant: CANON KABUSHIKI KAISHA, Tokyo (JP)

(72) Inventor: Hironori Maeda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/394,087

(22) Filed: Apr. 25, 2019

(65) Prior Publication Data
US 2019/0346774 A1  Nov. 14, 2019

(30) Foreign Application Priority Data
May 8, 2018  (JP) ................................ 2018-090109

(51) Int. Cl.
*G03F 9/00* (2006.01)
*G03F 7/20* (2006.01)

(52) U.S. Cl.
CPC ........ *G03F 9/7065* (2013.01); *G03F 7/70191* (2013.01); *G03F 7/70483* (2013.01);
(Continued)

(58) Field of Classification Search
CPC ........... H01L 21/68–682; H01L 23/544; H01L 2223/54426; G02B 26/008; G02B 26/02; G02B 26/023; G02B 5/20; G02B 5/204; G02B 5/205; G02B 5/208; G01B 11/002; G01B 11/02; G01B 11/026; G01B 11/028; G01B 11/03; G01B 9/04; G03F 9/70; G03F 9/7003; G03F 9/7046; G03F 9/7065; G03F 9/7073; G03F 9/7088; G03F 9/7092; G03F 7/70191; G03F 7/70625; G03F 7/70308; G03F 7/70575; G03F 7/70616;
(Continued)

(56) References Cited

U.S. PATENT DOCUMENTS 4,970,546 A * 11/1990 Suzuki ................... B23K 26/06
355/53
6,100,987 A * 8/2000 Kawakubo ............ G03F 9/7088
356/401

(Continued)

FOREIGN PATENT DOCUMENTS

JP  H08292580 A  11/1996
JP  2003092248 A  3/2003

*Primary Examiner* — Christina A Riddle
(74) *Attorney, Agent, or Firm* — Rossi, Kimms & McDowell LLP

(57) ABSTRACT

The present invention provides a measurement apparatus including a first filter unit including a plurality of first filters, and each configured to allow light having a different wavelength band to pass, a second filter unit including a plurality of second filters, and each configured to reduce light intensity of light and allow the light to pass, an obtaining unit configured to obtain data representing a transmittance of each of the plurality of second filters for a wavelength band of light having passed through each of the plurality of first filters, and a selection unit configured to select, based on the data obtained by the obtaining unit, from the plurality of second filters, one second filter arranged on an optical path together with one first filter among the plurality of first filters.

18 Claims, 11 Drawing Sheets

(52) U.S. Cl.
CPC ...... *G03F 7/70616* (2013.01); *G03F 7/70625* (2013.01); *G03F 9/7069* (2013.01)

(58) Field of Classification Search
CPC ............ G03F 7/70683; G03F 7/70716; G03F 7/70725; G03F 7/7085; G03F 7/70775; G03F 7/7095; G03F 7/70958; G03F 7/70316; G03F 9/7069; G03F 7/70483; G03F 7/70491; G03F 7/70508; G03F 7/70525; G03F 7/70533; G03F 7/70541
USPC .... 355/52, 53, 55, 67–71, 77; 356/399–401, 356/73, 51, 614–624, 625, 634, 635, 402, 356/416, 418, 419, 420, 425, 432–435; 250/492.1, 592.22, 492.23, 493.1, 505.1, 250/503.1, 504 R, 548; 359/350, 353, 359/359, 360, 885, 888, 889, 890, 891, 359/892, 589, 590

See application file for complete search history.

(56) References Cited

U.S. PATENT DOCUMENTS

| | | | |
|---|---|---|---|
| 6,870,623 B2 | 3/2005 | Tanaka et al. | |
| 2003/0068836 A1* | 4/2003 | Hongo | B23K 26/0648 438/30 |
| 2012/0287412 A1* | 11/2012 | Sakamoto | G03F 9/7096 355/67 |
| 2012/0307226 A1* | 12/2012 | Maeda | G03F 9/7088 355/72 |

* cited by examiner

FIG. 10

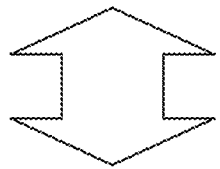

| | TRANSMITTANCE |
|---|---|
| NEUTRAL DENSITY FILTER ND1 | 100% |
| NEUTRAL DENSITY FILTER ND2 | 90% |
| NEUTRAL DENSITY FILTER ND3 | 80% |
| NEUTRAL DENSITY FILTER ND4 | 70% |
| NEUTRAL DENSITY FILTER ND5 | 60% |
| NEUTRAL DENSITY FILTER ND6 | 50% |
| NEUTRAL DENSITY FILTER ND7 | 40% |
| NEUTRAL DENSITY FILTER ND8 | 30% |
| NEUTRAL DENSITY FILTER ND9 | 20% |
| NEUTRAL DENSITY FILTER ND10 | 10% |

| ACTUAL TRANSMITTANCE | | |
|---|---|---|
| WAVELENGTH BAND WB1 | WAVELENGTH BAND WB2 | WAVELENGTH BAND WB3 |
| 100% | 100% | 100% |
| 90% | 90% | 90% |
| 80% | 80% | 80% |
| 70% | 70% | 70% |
| 60% | 60% | 60% |
| 50% | 50% | 50% |
| 40% | 40% | 40% |
| 30% | 30% | 30% |
| 20% | 20% | 20% |
| 10% | 10% | 10% |

PRIOR ART

F I G. 11
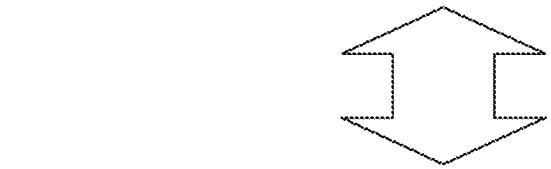
PRIOR ART

MEASUREMENT APPARATUS, EXPOSURE APPARATUS, AND METHOD OF MANUFACTURING ARTICLE

BACKGROUND OF THE INVENTION

Field of the Invention

The present invention relates to a measurement apparatus, an exposure apparatus, and a method of manufacturing an article.

Description of the Related Art

In recent years, exposure apparatuses used to manufacture semiconductor devices have been required to achieve high overlay accuracy of substrates together with micropatterning. Since about 1/5 of the resolution is generally required for the overlay accuracy, an improvement in overlay accuracy becomes increasingly important as micropatterning of a semiconductor device advances.

Widening the wavelength band of light (detection light) for detecting an alignment mark is considered as a means for improving the overlay accuracy. Especially, in recent years, a process such as a color filter process in which low contrast and low accuracy are obtained with visible light has increased, thereby requiring a position measurement apparatus that can use light of a wide wavelength band including near-infrared light and light (blue wavelength light) having a blue wavelength other than visible light.

In a position measurement apparatus, a neutral density filter is generally used as a neutral density means, as disclosed in Japanese Patent Laid-Open Nos. 2003-092248 and 8-292580. Japanese Patent Laid-Open No. 2003-092248 discloses a technique of arranging a plurality of neutral density filters having discrete transmittances on a rotatable turret, and selectively using each neutral density filter as that having the same transmittance regardless of the wavelength band of detection light. Furthermore, Japanese Patent Laid-Open No. 8-292580 discloses a technique of providing an illumination optical system for each wavelength band of detection light, and arranging a neutral density filter on the optical path of each illumination optical system.

However, when widening the wavelength band of the detection light, the conventional position measurement apparatus cannot reduce the light intensity accurately, thereby lowering the throughput. This is caused by the fact that the neutral density filter has a flat dimming rate for visible light but cannot implement the same dimming rate as that for the visible light with respect to blue wavelength light or infrared light. Therefore, even if the same neutral density filter is used for the infrared light by assuming that the same dimming rate as that for the visible light is implemented, the dimming rate for the infrared light may actually be higher or lower than that for the visible light. In this case, it takes time to adjust (perform light control) the light amount of the detection light using the neutral density filter, resulting in a decrease in throughput. On the other hand, the technique of arranging the neutral density filter on the optical path of each illumination optical system provided for each wavelength band of the detection light leads to complication of an optical system, an increase in size, and an increase in cost.

SUMMARY OF THE INVENTION

The present invention provides a measurement apparatus advantageous in suppressing a decrease in throughput in spite of a simple arrangement.

According to one aspect of the present invention, there is provided a measurement apparatus for measuring a position of a substrate by detecting a mark on the substrate, including a first filter unit including a plurality of first filters arranged on an optical path between a light source configured to output light for illuminating the mark and an image sensor configured to capture the mark, each of the plurality of first filters being configured to allow light having a different wavelength band to pass, a second filter unit including a plurality of second filters arranged on the optical path between the light source and the image sensor, and each configured to reduce light intensity of light and allow the light to pass, an obtaining unit configured to obtain data representing a transmittance of each of the plurality of second filters for a wavelength band of light having passed through each of the plurality of first filters, and a selection unit configured to select, based on the data obtained by the obtaining unit, from the plurality of second filters, one second filter arranged on the optical path together with one first filter among the plurality of first filters.

Further features of the present invention will become apparent from the following description of exemplary embodiments with reference to the attached drawings.

BRIEF DESCRIPTION OF THE DRAWINGS

FIG. 10 is a view showing the relationship between an actual transmittance and the transmittance of each neutral density filter managed by a conventional exposure apparatus.

FIG. 11 is a view showing the relationship between an actual transmittance and the transmittance of each neutral density filter managed by the conventional exposure apparatus.

DESCRIPTION OF THE EMBODIMENTS

Figure 1:
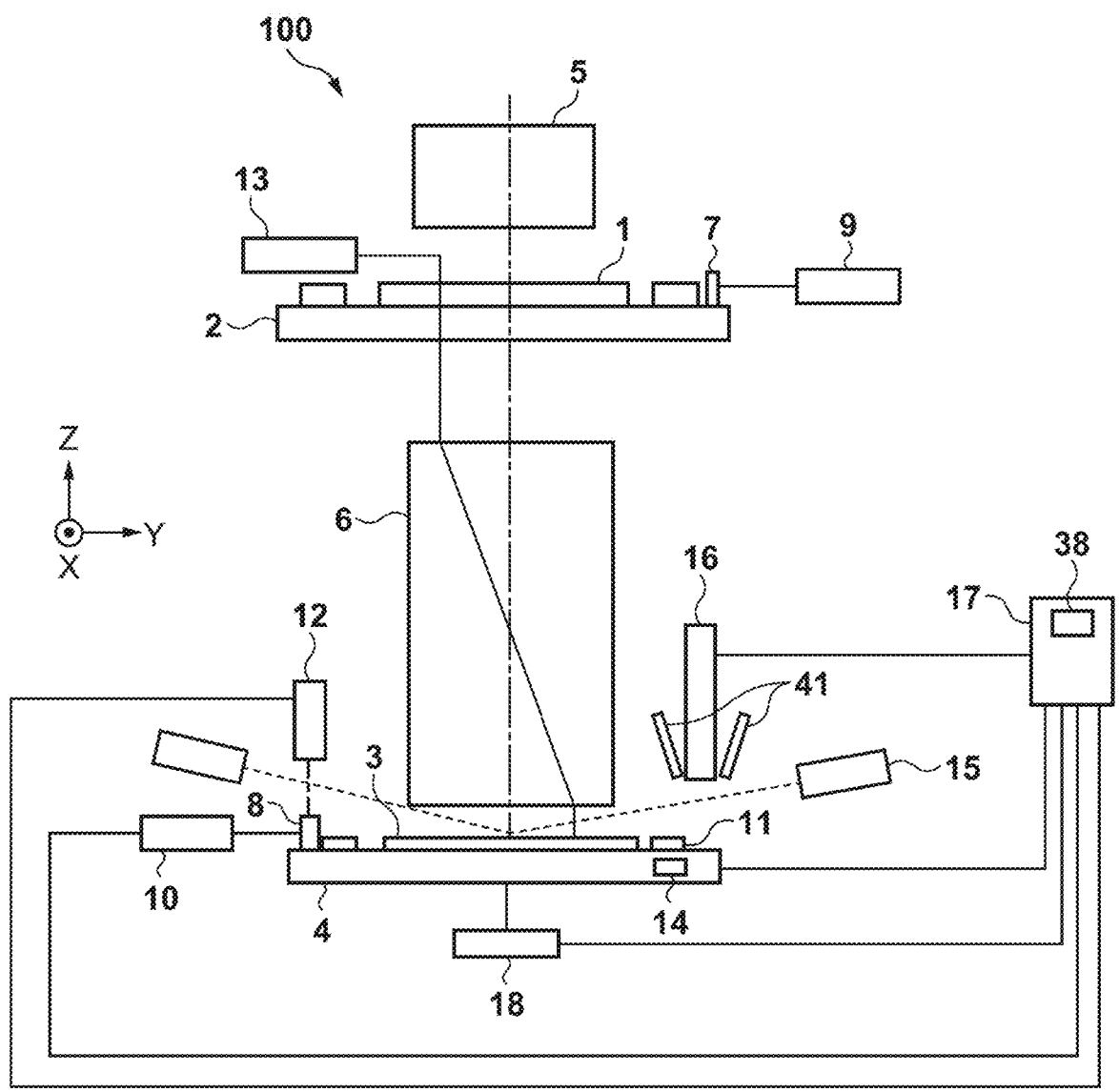
FIG. 1 is a schematic view showing the arrangement of an exposure apparatus as one aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an exposure apparatus 100 as one aspect of the present invention. The exposure apparatus 100 is a lithography apparatus that forms a pattern on a substrate. The exposure apparatus 100 includes a reticle stage 2 that holds a reticle 1, a substrate stage 4 that holds a substrate 3, and an illumination optical system 5 that illuminates the reticle 1 held by the reticle stage 2. The exposure apparatus 100 also includes a projection optical system 6 that projects (the image of) the pattern of the reticle 1 onto the substrate 3 held by the substrate stage 4, and a control unit 17 that comprehensively controls the overall operation of the exposure apparatus 100.

In this embodiment, the exposure apparatus 100 is a scanning exposure apparatus (scanner) that transfers the pattern of the reticle 1 to the substrate 3 while synchronously scanning the reticle 1 and the substrate 3 in the scanning direction (that is, by a step & scan method). However, the exposure apparatus 100 may be an exposure apparatus (stepper) that projects the pattern of the reticle 1 onto the substrate 3 while fixing the reticle 1 (that is, by a step & repeat method).

In the following description, a direction (optical axis direction) coincident with the optical axis of the projection optical system 6 will be defined as the Z-axis direction. The scanning direction of the reticle 1 and the substrate 3 in a plane perpendicular to the Z-axis direction will be defined the Y-axis direction. A direction (non-scanning direction) perpendicular to the Z- and Y-axis directions will be defined as the X-axis direction. Directions around the X-, Y-, and Z-axes will be defined as $\theta X$, $\theta Y$, and $\theta Z$ directions, respectively.

The illumination optical system 5 illuminates the reticle 1, more specifically, a predetermined illumination region on the reticle with light (exposure light) of a uniform illuminance distribution. Examples of the exposure light are the g-ray and i-ray of ultra-high pressure mercury lamps, a KrF excimer laser, an ArF excimer laser, and an $F_2$ laser. To manufacture a smaller semiconductor device, extreme ultraviolet light (EUV light) of several nm to several hundred nm may be used as the exposure light.

The reticle stage 2 holds the reticle 1, and is configured to be two-dimensionally movable in a plane perpendicular to the optical axis of the projection optical system 6, that is, in the X-Y plane and be rotatable in the $\theta Z$ direction. A driving device (not shown) such as a linear motor drives the reticle stage 2.

A mirror 7 is arranged on the reticle stage 2. A laser interferometer 9 is arranged at a position facing the mirror 7. The laser interferometer 9 measures the two-dimensional position and rotation angle of the reticle stage 2 in real time, and outputs the measurement result to the control unit 17. The control unit 17 controls the driving device based on the measurement result of the laser interferometer 9, and positions the reticle 1 held by the reticle stage 2.

The projection optical system 6 includes a plurality of optical elements, and projects the pattern of the reticle 1 onto the substrate 3 at a predetermined projection magnification $\beta$. In this embodiment, the projection optical system 6 is a reduction optical system having the projection magnification $\beta$ of, for example, ¼ or ⅕.

The substrate stage 4 includes a Z stage that holds the substrate 3 via a chuck, an X-Y stage that supports the Z stage, and a base that supports the X-Y stage. A driving device such as a linear motor drives the substrate stage 4.

A mirror 8 is arranged on the substrate stage 4. Laser interferometers 10 and 12 are arranged at positions facing the mirror 8. The laser interferometer 10 measures positions of the substrate stage 4 in the X-axis direction, Y-axis direction, and $\theta Z$ direction in real time, and outputs the measurement result to the control unit 17. Similarly, the laser interferometer 12 measures positions of the substrate stage 4 in the Z-axis direction, $\theta X$ direction, and $\theta Y$ direction in real time, and outputs the measurement result to the control unit 17. The control unit 17 controls the driving device based on the measurement results of the laser interferometers 10 and 12, and positions the substrate 3 held by the substrate stage 4.

A reticle alignment measurement system 13 is arranged near the reticle stage 2. The reticle alignment measurement system 13 detects a reticle reference mark (not shown) provided on the reticle 1 held by the reticle stage 2, and a reference mark 39 provided on a stage reference plate 11 arranged on the substrate stage 4 through the projection optical system 6.

The reticle alignment measurement system 13 detects the reticle reference mark provided on the reticle 1, and the reference mark 39 through the projection optical system 6 by using the same light source as that used when actually exposing the substrate 3. More specifically, the reticle alignment measurement system 13 detects, by an image sensor (for example, a photoelectric conversion element such as a CCD camera), light beams reflected by the reticle reference mark and the reference mark 39. The reticle 1 and the substrate 3 are positioned (aligned) based on a detection signal from the image sensor. At this time, when the position and focus are adjusted between the reticle reference mark provided on the reticle 1 and the reference mark 39 provided on the stage reference plate 11, the relative positional relationship (X, Y, and Z) between the reticle 1 and the substrate 3 can be adjusted.

A reticle alignment measurement system 14 is arranged on the substrate stage 4. The reticle alignment measurement system 14 is a transmission measurement system and is used when the reference mark 39 is a transmission mark. The reticle alignment measurement system 14 detects the reticle reference mark provided on the reticle 1 and the reference mark 39 by using the same light source as that used when actually exposing the substrate 3. More specifically, the reticle alignment measurement system 14 detects the transmitted light having passed through the reticle reference mark and the reference mark 39 using a light amount sensor. At this time, the reticle alignment measurement system 14 detects the light amount of the transmitted light while moving the substrate stage 4 in the X-axis direction (or Y-axis direction) and the Z-axis direction. Accordingly, the position and focus can be adjusted between the reticle reference mark provided on the reticle 1 and the reference mark 39 provided on the stage reference plate 11.

In this way, the reticle alignment measurement system 13 or the reticle alignment measurement system 14 can be arbitrarily used to adjust the relative positional relationship (X, Y, and Z) between the reticle 1 and the substrate 3.

The stage reference plate 11 is arranged at the corner of the substrate stage 4 to be almost flush with the surface of the substrate 3 held by the substrate stage 4. The stage reference plate 11 may be arranged at one corner of the substrate stage 4, or the stage reference plates 11 may be arranged at a plurality of corners of the substrate stage 4.

Figure 3:
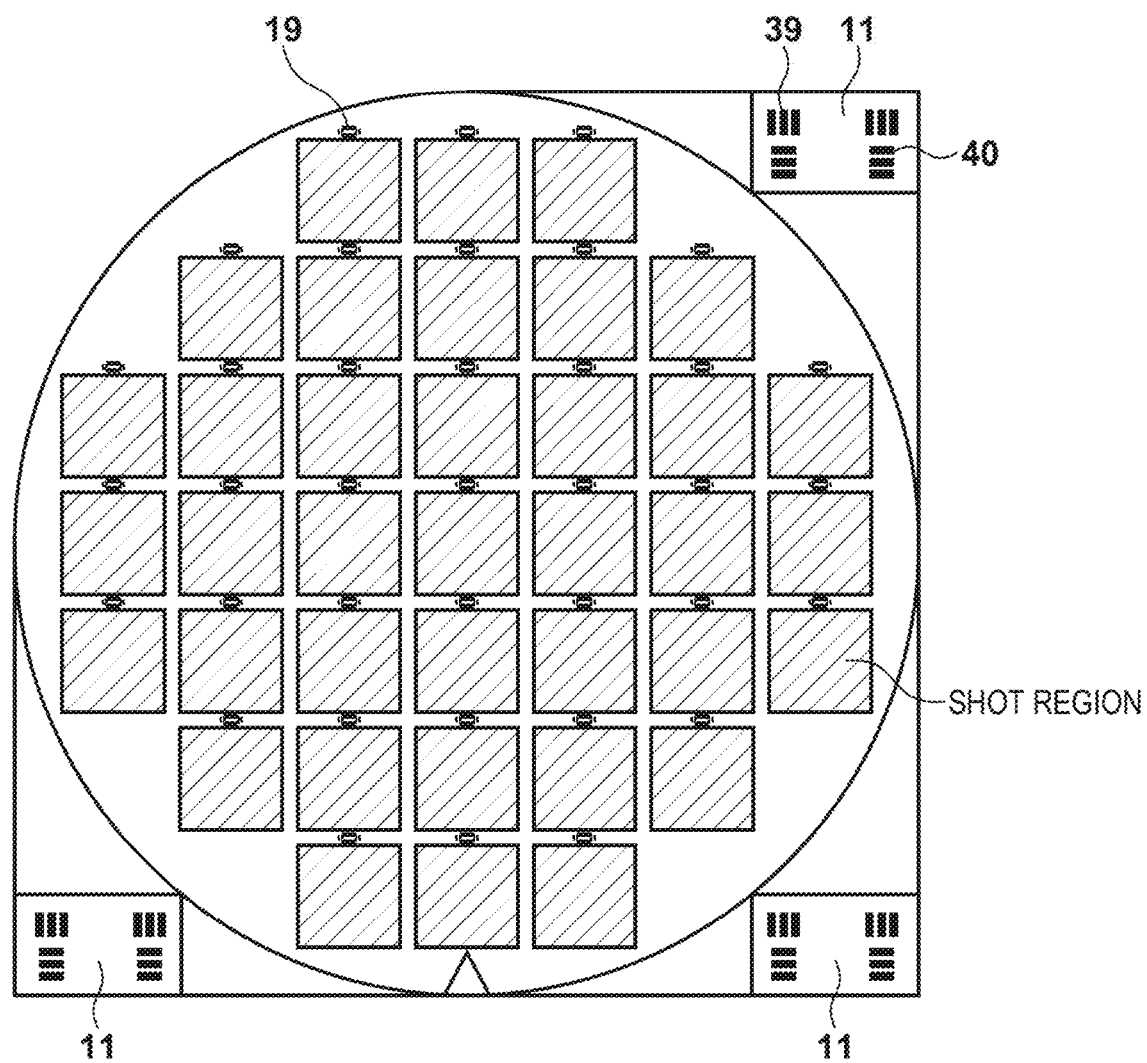
FIG. 3 is a schematic view showing the detailed arrangement of a substrate alignment measurement system.

As shown in FIG. 3, the stage reference plate 11 includes the reference mark 39 that is detected by the reticle alignment measurement system 13 or 14, and a reference mark 40 that is detected by a substrate alignment measurement system 16. The stage reference plate 11 may have a plurality of reference marks 39 and a plurality of reference marks 40. The positional relationship (X- and Y-axis directions) between the reference marks 39 and 40 is set to a predetermined one (that is, is known). Note that the reference marks 39 and 40 may be common marks.

A focus measurement system 15 includes a projection system that obliquely projects light onto the surface of the substrate 3, and a light receiving system that receives light reflected by the surface of the substrate 3. The focus measurement system 15 measures a position of the substrate 3 in the Z-axis direction, and outputs the measurement result to the control unit 17. The control unit 17 controls, based on the measurement result of the focus measurement system 15, the driving device that drives the substrate stage 4, and adjusts a position of the substrate 3 in the Z-axis direction and the inclination angle of the substrate 3 held by the substrate stage 4.

The substrate alignment measurement system 16 includes an illumination system that illuminates an alignment mark 19 provided on the substrate 3 and the reference mark 40 provided on the stage reference plate 11, and a light receiving system that receives light beams from the marks. The substrate alignment measurement system 16 measures the position of the alignment mark 19 and that of the reference mark 40, and outputs the measurement result to the control unit 17. The control unit 17 controls, based on the measurement result of the substrate alignment measurement system 16, the driving device that drives the substrate stage 4, and adjusts positions of the substrate 3 in the X- and Y-axis directions that is held by the substrate stage 4.

The substrate alignment measurement system 16 includes a focus measurement system (AF measurement system) 41 for the substrate alignment measurement system. Similar to the focus measurement system 15, the AF measurement system 41 includes a projection system that obliquely projects light onto the surface of the substrate 3, and a light receiving system that receives light reflected by the surface of the substrate 3. The focus measurement system 15 is used for focusing of the projection optical system 6, whereas the AF measurement system 41 is used for focusing of the substrate alignment measurement system 16.

In general, the arrangement of the substrate alignment measurement system is roughly divided into two: an off-axis alignment (OA) measurement system and a TTL (Through The Lens alignment) measurement system. The OA measurement system optically detects an alignment mark provided on a substrate without the intervention of a projection optical system. The TTL measurement system detects an alignment mark provided on a substrate through a projection optical system by using light (non-exposure light) different in wavelength from exposure light. Although the substrate alignment measurement system 16 is the OA measurement system in this embodiment, the present invention does not limit the alignment detection method. For example, when the substrate alignment measurement system 16 is the TTL measurement system, it detects the alignment mark provided on the substrate through the projection optical system 6. Except this, the basic arrangement is the same as that of the OA measurement system.

The control unit 17 is formed by, for example, a computer including a CPU and a memory, and comprehensively controls the respective units of the exposure apparatus 100 according to a program stored in a storage unit. In this embodiment, the control unit 17 controls exposure processing of transferring the pattern of the reticle 1 to the substrate 3, that is, exposing the substrate 3. In the exposure processing, the control unit 17 controls the position of the substrate stage 4 based on, for example, the measurement result of the substrate alignment measurement system 16. With respect to the substrate alignment measurement system 16, the control unit 17 controls processing associated with adjustment of the light amount of light for illuminating the alignment mark 19 provided on the substrate 3. As will be described later, for example, the control unit 17 functions as an obtaining unit that obtains transmittance data representing the transmittance of each of a plurality of neutral density filters provided on a neutral density filter plate 36 for the wavelength bands of light beams having passed through respective wavelength filters provided on a wavelength filter plate 22. The control unit 17 also functions as a selection unit that selects, from the plurality of neutral density filters (second filters) provided on the neutral density filter plate 36, one neutral density filter to be used for light control of the light for illuminating the alignment mark 19. Furthermore, the control unit 17 functions as a selection unit that selects, from the plurality of wavelength filters provided on the wavelength filter plate 22, one wavelength filter corresponding to the wavelength band of the light to be used for illuminating the alignment mark 19.

The substrate alignment measurement system 16 will be described in detail with reference to FIG. 3. FIG. 3 is a schematic view showing the detailed arrangement of the substrate alignment measurement system 16. The substrate alignment measurement system 16 functions as a measurement device that measures the position of the substrate 3 by detecting the alignment mark 19 provided on the substrate 3. The substrate alignment measurement system 16 includes a light source 20, a first capacitor optical system 21, the wavelength filter plate 22, a second capacitor optical system 23, the neutral density filter plate 36, an aperture stop plate 24, a first illumination system 25, a second illumination system 27, and a polarizing beam splitter 28. Furthermore, the substrate alignment measurement system 16 includes an NA stop 26, a λ/4 plate 29, an objective lens 30, a relay lens 31, a first imaging system 32, a coma adjustment optical member 35, a second imaging system 33, a wavelength shift difference adjustment optical member 37, and a photoelectric conversion element 34.

The light source 20 emits (outputs) light for illuminating the alignment mark 19. In this embodiment, the light source 20 emits visible light (for example, light having a wavelength of 550 nm (inclusive) to 700 nm (inclusive)), blue wavelength light (for example, light (blue wavelength light) having a wavelength of 450 nm (inclusive) to 550 nm (inclusive)), and infrared light (for example, light having a wavelength of 700 nm (inclusive) to 1,500 nm (inclusive)). The light emitted from the light source 20 passes through the first capacitor optical system 21, the wavelength filter plate 22, the second capacitor optical system 23, and the neutral density filter plate 36, and reaches the aperture stop plate 24 located on the pupil plane (optical Fourier transform plane with respect to the object plane) of the substrate alignment measurement system 16.

The wavelength filter plate 22 is arranged on the optical path between the light source 20 and the photoelectric conversion element 34. A plurality of wavelength filters (first filters) that pass light beams whose wavelength bands are different from each other are arranged on the wavelength filter plate 22. One wavelength filter is selected from the plurality of wavelength filters under the control of the control unit 17, and is arranged on the optical path of the substrate alignment measurement system 16. As a detailed arrangement, a first driving unit FDU is provided in the substrate alignment measurement system 16 to drive the wavelength filter plate 22 so as to selectively arrange, on the optical path, one wavelength filter among the plurality of wavelength filters provided on the wavelength filter plate 22. The control unit 17 controls the first driving unit FDU to arrange, on the optical path, one wavelength filter among the plurality of wavelength filters based on an input signal. Note that the first driving unit FDU is formed by, for example, a rotation mechanism that rotates a turret on which a plurality of wavelength filters are provided. As described above, the wavelength filter plate 22 functions as the first filter unit in which one wavelength filter corresponding to the wavelength band of the light to be used for illuminating the alignment mark 19 provided on the substrate 3 is selected from the plurality of wavelength filters.

The wavelength filter plate 22 includes the plurality of wavelength filters so as to select, within the range of 400 nm (inclusive) to 1,200 nm (inclusive), the wavelength band of the light for illuminating the alignment mark 19. Note that the width of the wavelength band of the light allowed to pass through each of the plurality of wavelength filters is set within, for example, the range of 100 nm (inclusive) to 150 nm (inclusive). In this embodiment, on the wavelength filter plate 22, a wavelength filter that allows infrared light (light of a red wavelength band) to pass, a wavelength filter that allows visible light (light of a green wavelength band) to pass, and a wavelength filter that allows blue wavelength light to pass are arranged. On the wavelength filter plate 22, by switching among the wavelength filters, it is possible to select the wavelength band of the light for illuminating the alignment mark 19 provided on the substrate 3. Furthermore, the wavelength filter plate 22 may have an arrangement in which a new wavelength filter can be added in addition to the plurality of wavelength filters provided in advance.

The neutral density filter plate 36 is arranged on the optical path between the light source 20 and the photoelectric conversion element 34, in this embodiment, the optical path between the wavelength filter plate 22 and the photoelectric conversion element 34. A plurality of different neutral density filters that reduce the light intensity and allow light to pass are arranged on the neutral density filter plate 36. One neutral density filter is selected from the plurality of neutral density filters under the control of the control unit 17, and is arranged on the optical path of the substrate alignment measurement system 16. As a detailed arrangement, a second driving unit SDU is provided in the substrate alignment measurement system 16 to drive the neutral density filter plate 36 so as to selectively arrange, on the optical path, one neutral density filter among the plurality of neutral density filters provided on the neutral density filter plate 36. Note that the second driving unit SDU is formed by, for example, a rotation mechanism that rotates a turret on which a plurality of neutral density filters are provided. The control unit 17 controls the second driving unit SDU to arrange, on the optical path, one neutral density filter among the plurality of neutral density filters. As described above, the neutral density filter plate 36 functions as the second filter unit in which one neutral density filter is selected from the plurality of neutral density filters. The neutral density filter plate 36 may have an arrangement in which a new neutral density filter can be added in addition to the plurality of neutral density filters provided in advance.

Figure 4:
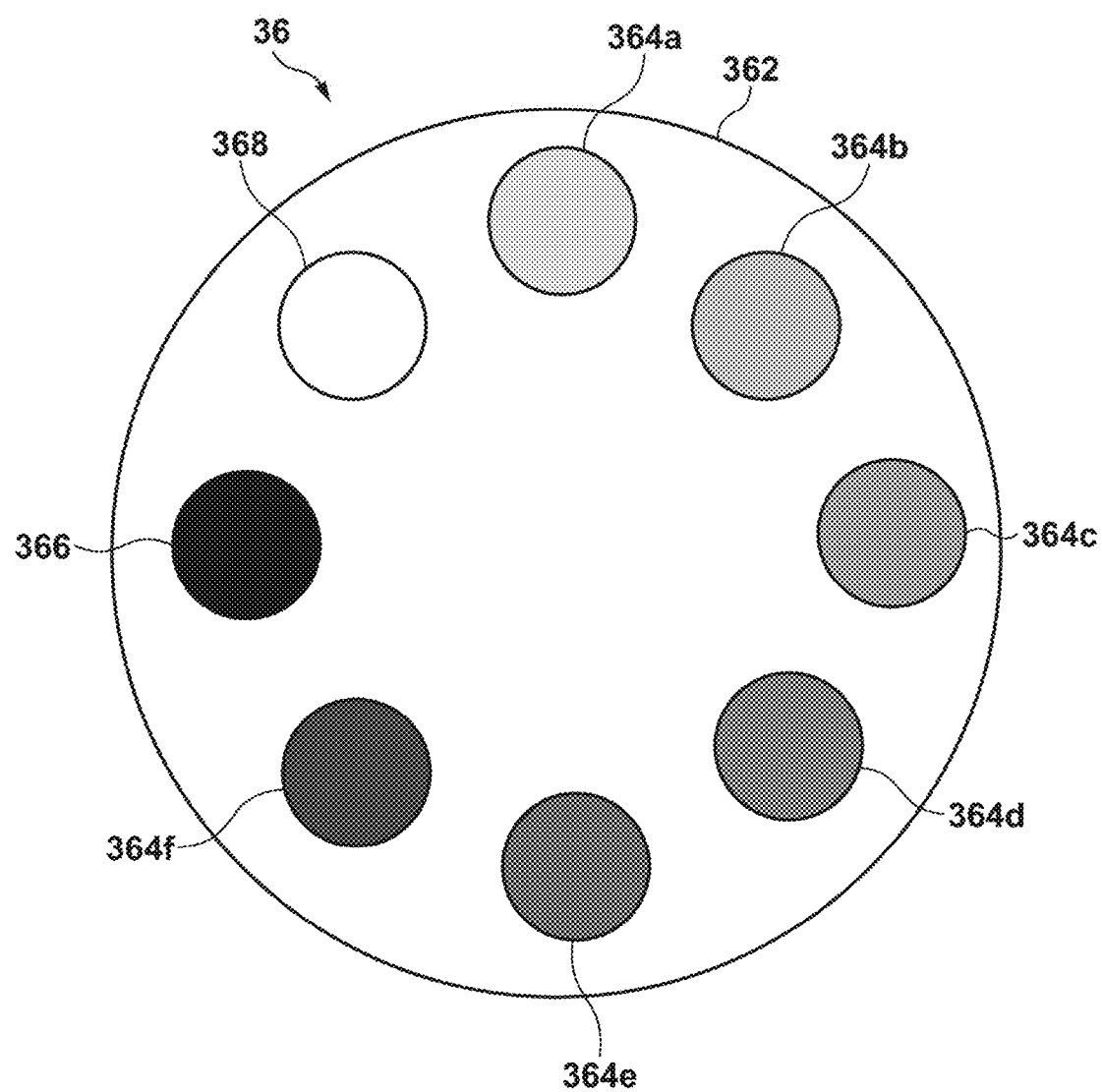
FIG. 4 is a view showing an example of the arrangement of a neutral density filter plate.

FIG. 4 is a view showing an example of the arrangement of the neutral density filter plate 36. As shown in FIG. 4, the neutral density filter plate 36 includes a turret 362 and a plurality of neutral density filters 364a to 364f having different dimming rates (transmittances) and arranged on the turret 362. The neutral density filters 364a to 364f are each formed by, for example, a film including a metal layer. In addition, the neutral density filter plate 36 includes a portion 366 where a filter hole of the turret 362 is covered for complete light shielding, and a portion 368 where no neutral density filter is formed in a filter hole of the turret 362 for complete transmission.

Figure 2:
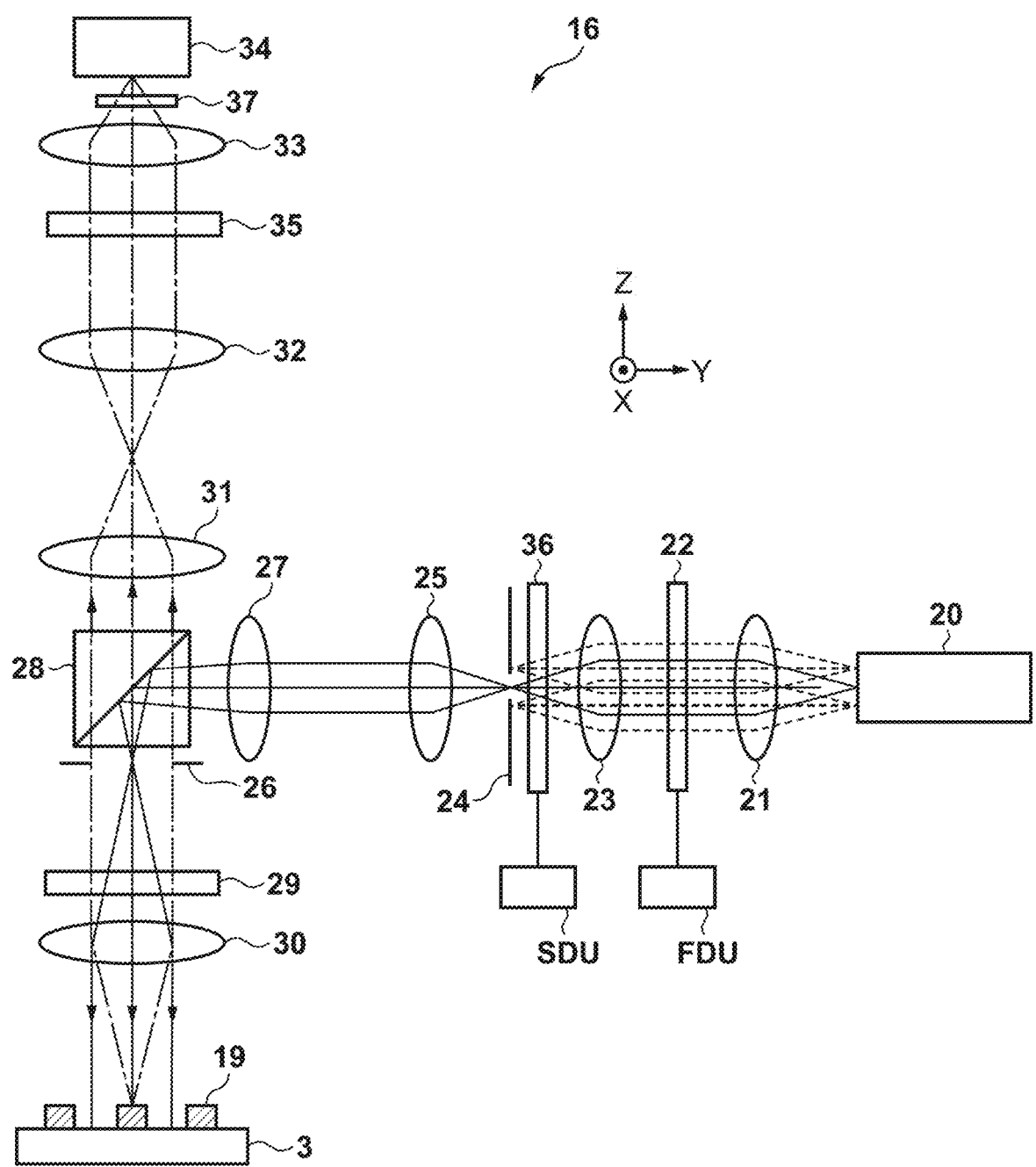
FIG. 2 is a view showing the arrangement of a stage reference plate arranged on a substrate stage.

FIG. 2 shows only one neutral density filter plate 36. However, for example, by providing two neutral density filter plates and combining two neutral density filters, it becomes possible to set a dimming rate more finely. In the neutral density filter plate 36, neither the portion 366 for complete light shielding nor the portion 368 for complete transmission is essential, and a neutral density filter plate that forms no such portions may be applied. For example, for complete light shielding, the light source 20 can be powered off instead of mechanically covering the filter hole of the turret 362.

The aperture stop plate 24 includes a plurality of aperture stops different in illumination a. The aperture stop plate 24 can change the illumination a of the light for illuminating the alignment mark 19 by switching an aperture stop to be arranged on the optical path of the substrate alignment measurement system 16 under the control of the control unit 17. The aperture stop plate 24 may have an arrangement in which a new aperture stop can be added in addition to the plurality of aperture stops provided in advance.

Light that has reached the aperture stop plate 24 is guided to the polarizing beam splitter 28 through the first illumination system 25 and the second illumination system 27. Of the light guided to the polarizing beam splitter 28, S-polarized light perpendicular to the paper surface of the drawing is reflected by the polarizing beam splitter 28, passes through the NA stop 26 and the λ/4 plate 29, and is converted into circularly polarized light. The light having passed through the λ/4 plate 29 illuminates, via the objective lens 30, the alignment mark 19 provided on the substrate 3. The NA of the NA stop 26 can be changed by changing the aperture value under the control of the control unit 17.

Light beams reflected, diffracted, and scattered by the alignment mark 19 pass through the objective lens 30, are transmitted through the λ/4 plate 29, and are converted into P-polarized light parallel to the paper surface of the drawing. The P-polarized light is transmitted through the polarizing beam splitter 28 via the NA stop 26. The light transmitted through the polarizing beam splitter 28 reaches the photoelectric conversion element (for example, an image sensor such as a CCD image sensor) 34 through the relay lens 31, the first imaging system 32, the coma adjustment optical member 35, the second imaging system 33, and the wavelength shift difference adjustment optical member 37. The light that reaches the photoelectric conversion element 34 forms an image of the alignment mark 19 on the photoelectric conversion element. The photoelectric conversion element 34 detects the light from the alignment mark 19, and can extend an accumulation time until the intensity of the light exceeds a predetermined threshold. The control unit 17 controls the accumulation time of the photoelectric conversion element 34. Furthermore, the control unit 17 obtains (functions as a calculation unit) the position of the substrate 3 based on an output signal (a signal corresponding to the image of the alignment mark 19 formed on the photoelectric conversion element) from the photoelectric conversion element 34.

When the substrate alignment measurement system 16 detects the alignment mark 19 provided on the substrate 3, monochromatic light or light of a narrow wavelength band generates interference fringes because a resist (transparent layer) is applied (formed) on the alignment mark 19. Thus, a signal of the interference fringes is added to an alignment signal from the photoelectric conversion element 34, and the alignment mark 19 cannot be detected with high accuracy. In general, a light source that emits light of a wide wavelength band is used as the light source 20 to reduce addition of a signal of interference fringes to an alignment signal from the photoelectric conversion element 34.

Figure 5:
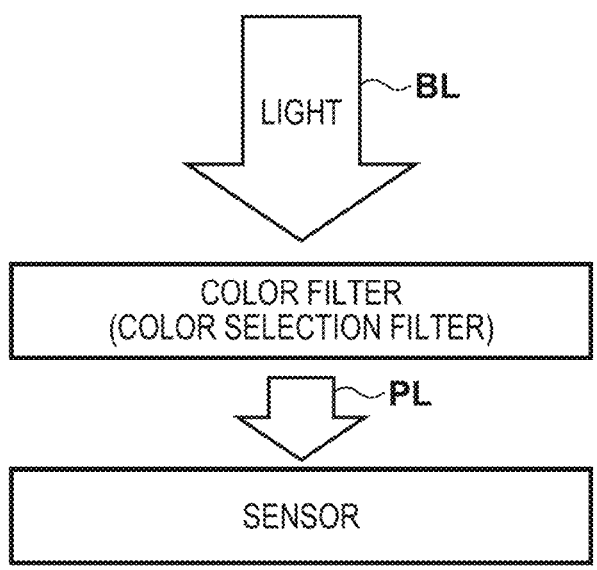
FIG. 5 is a view for explaining a color filter.

As described above, the substrate alignment measurement system 16 uses light of a wide wavelength band to reduce interference fringes caused by a resist. In recent years, however, a process (color filter process) of handling a color filter that allows only light of a specific wavelength to pass is increased. The color filter is a color selection filter arranged on a sensor such as a CCD image sensor or a CMOS image sensor, as shown in FIG. 5. By making the light pass through the color filter, the pixels of the sensor can hold color information. More specifically, as shown in FIG. 5, when light BL of a broad wavelength enters the color filter, only light PL that can pass through the color filter reaches the sensor, and thus the pixels of the sensor can hold color information.

Figure 6:
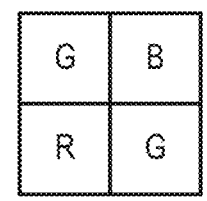
FIG. 6 is a view showing RGB color filters.

For example, in the RGB color filter process, as shown in FIG. 6, color filters that allow red wavelength (R) light, green wavelength (G) light, and blue wavelength (B) light, respectively, to pass are arranged parallelly on the sensor. In device manufacturing in the RGB color filter process, alignment needs to be performed via each color filter, and it is thus necessary to switch the wavelength band widely from the blue wavelength to the red wavelength.

Figure 7:
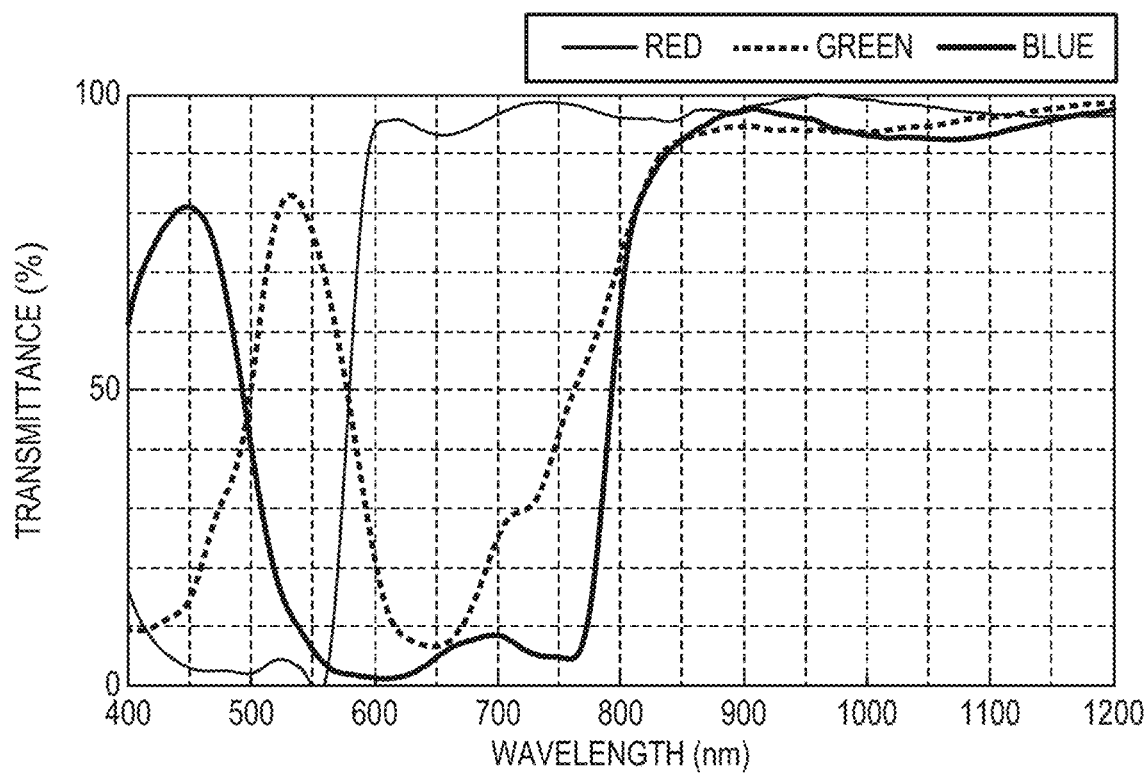
FIG. 7 is a graph showing examples of the transmittances of the RGB color filters.

FIG. 7 is a graph showing examples of the transmittances of the RGB color filters. In FIG. 7, the abscissa represents the wavelength and the ordinate represents the transmittance. Referring to FIG. 7, the R color filter has a high transmittance for light having a wavelength of 600 nm or more but hardly transmits light having a wavelength less than 550 nm. Therefore, to perform alignment via the R color filter, it is necessary to use light having a wavelength of 600 nm or more. The G color filter has the peak of the transmittance near a wavelength of 530 nm. Therefore, to perform alignment via the G color filter, it is necessary to use light having a wavelength near 530 nm or light having a wavelength of 850 nm or more. Furthermore, the B color filter has the peak of the transmittance near a wavelength of 450 nm. Therefore, to perform alignment via the B color filter, it is necessary to use light having a wavelength near 450 nm or light having a wavelength of 850 nm or more.

As described above, in the RGB color filter process, it is necessary to perform alignment using light having a wavelength that is transmitted through each color filter or light having a wavelength of 850 nm or more that is transmitted through all the color filters. Thus, it is considered to use only light having a wavelength of 850 nm or more that is transmitted through all the color filters, that is, infrared light. However, in the actual process, since various layers are overlaid in addition to the color filters, it may be impossible to obtain contrast using only the infrared light depending on interference conditions. Therefore, in the RGB color filter process, it is important to perform alignment by selecting light having a wavelength that is transmitted through the color filters and makes it possible to obtain contrast.

In the substrate alignment measurement system 16, if the wavelength of the light for illuminating the alignment mark 19 is switched, the reflectance of the process and the spectral characteristics (light source power, sensor sensitivity, lens transmittance, and the like) of the optical system change due to the wavelength, thereby requiring light amount adjustment (light control). Light control of the light for illuminating the alignment mark 19 can be performed by, for example, selecting the neutral density filter on the neutral density filter plate 36, controlling the output of the light source 20, or controlling the accumulation time of the photoelectric conversion element 34. However, if the wavelength of the light for illuminating the alignment mark 19 is switched, light control of the light for illuminating the alignment mark 19 is generally performed by selecting the neutral density filter on the neutral density filter plate 36. This is because control (voltage adjustment or the like) of the output of the light source 20 influences the life of the light source 20, and control of the accumulation time of the photoelectric conversion element 34 influences the throughput. Therefore, in a process of frequently switching the wavelength of the light for illuminating the alignment mark 19, that is represented by the color filter process, it is necessary to finely reduce the light intensity of the light by the neutral density filter to make the light amount of the light fall within a light amount range detectable by the photoelectric conversion element 34.

Figure 8:
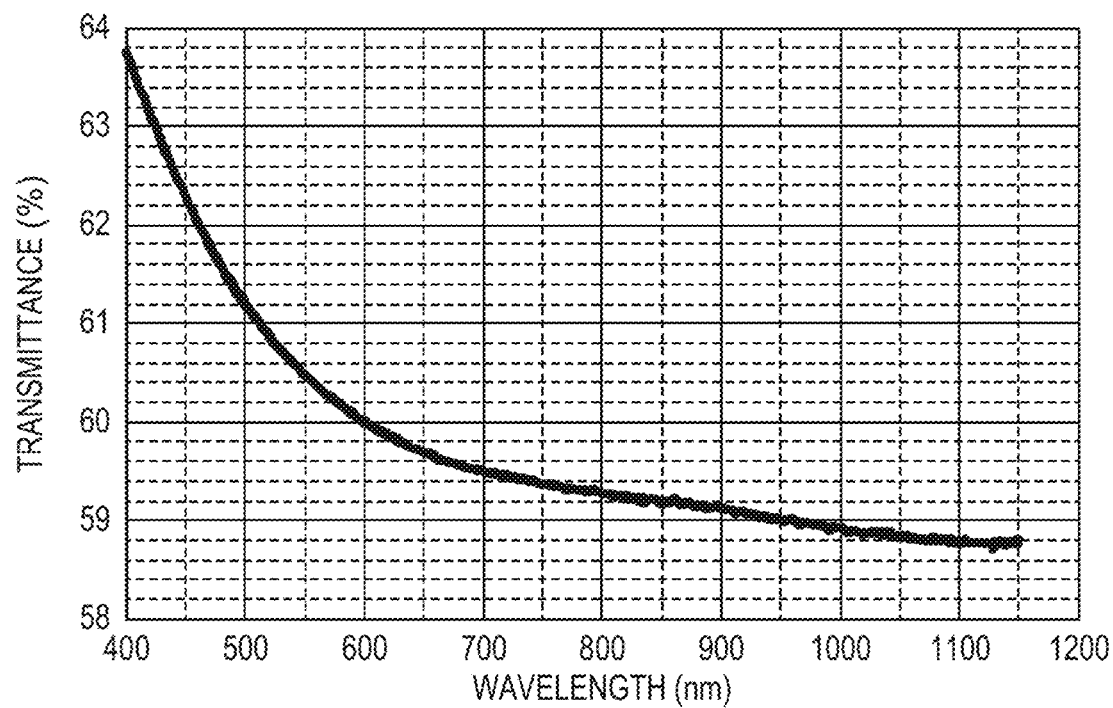
FIG. 8 is a graph showing an example of the transmittance characteristic of a neutral density filter.

In this embodiment, as shown in FIG. 4, the plurality (of kinds) of neutral density filters 364a to 364f are arranged on the neutral density filter plate 36. FIG. 8 is a graph showing an example of the transmittance characteristic of one neutral density filter among the neutral density filters 364a to 364f. In FIG. 8, the abscissa represents the wavelength and the ordinate represents the transmittance. The neutral density filter is designed for the purpose of uniformly reducing the light intensity (that is, having a uniform transmittance) regardless of the wavelength. However, the wavelength band used in the color filter process is wide, and it is very difficult to implement the neutral density filter having the uniform transmittance for such wide wavelength band.

The neutral density filter shown in FIG. 8 is a neutral density filter designed to have a transmittance of 60%. However, as shown in FIG. 8, it is apparent that the transmittance for visible light (light having a wavelength of 600 nm) is 60% and the transmittance for blue wavelength light (light having a wavelength of 450 nm) is 62% which separates to the positive side from the transmittance for the visible light. On the other hand, it is apparent that the transmittance for infrared light (light having a wavelength of 900 nm) is about 59% which separates to the negative side from the transmittance for the visible light.

In the conventional technique, the transmittance of the neutral density filter shown in FIG. 8 is set to 60% for the entire wavelength band, and thus the transmittances are shifted from the actual transmittances for the blue wavelength light and the infrared light. Therefore, if the light is switched to the blue wavelength light or the infrared light, it may be impossible to make the light amount within the light amount range detectable by the photoelectric conversion element 34, and it may be necessary to perform light control again, thereby lowering the throughput.

As shown in FIG. 8, if there exists only the neutral density filter that has the tendency of the transmittance to decrease from a short wavelength to a long wavelength, the neutral density filter is used in consideration of the tendency. More specifically, it is considered to use the neutral density filter by assuming that, with reference to the transmittance for the visible light, the transmittance becomes positive at a constant rate on the short wavelength side, and becomes negative at a constant rate on the long wavelength side.

Figure 9:
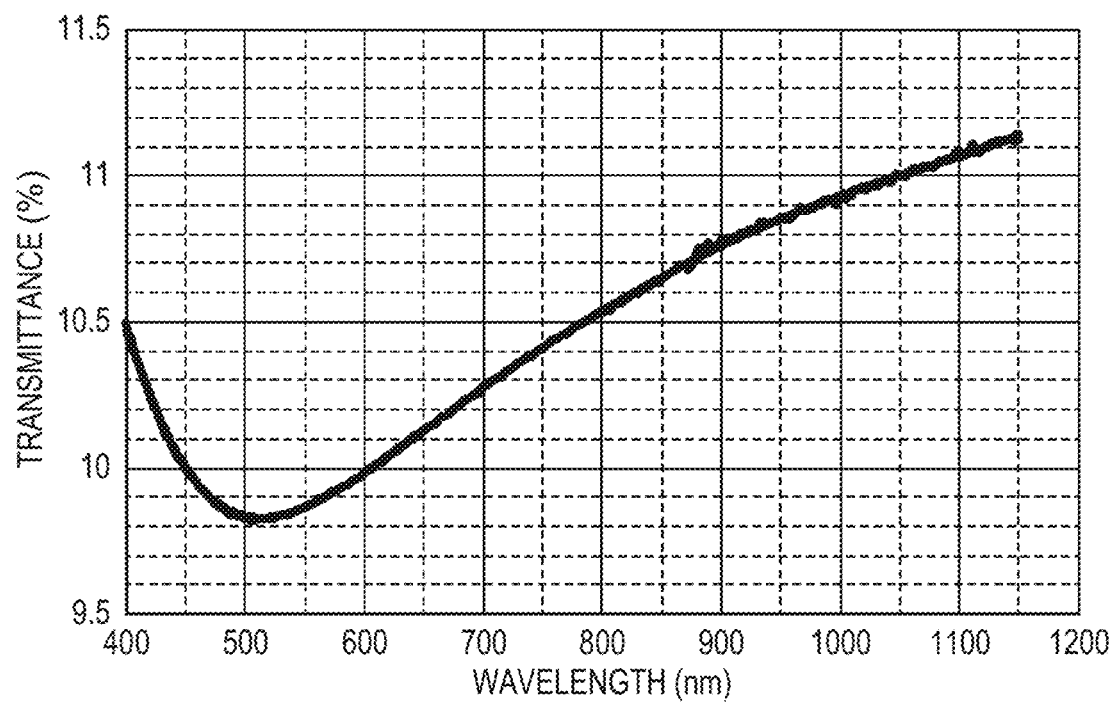
FIG. 9 is a graph showing an example of the transmittance characteristic of a neutral density filter.

However, the transmittance characteristics of the neutral density filters arranged on the neutral density filter plate 36 actually vary extremely. For example, as shown in FIG. 9, there exists a neutral density filter designed to have a transmittance of 10%. FIG. 9 is a graph showing an example of the transmittance characteristic of the neutral density filter, in which the abscissa represents the wavelength and the ordinate represents the transmittance. The neutral density filter shown in FIG. 9 has a transmittance of 10% for the visible light (light having a wavelength of 600 nm), a transmittance of about 9.9% for the blue wavelength light (light having a wavelength of 450 nm (inclusive) to 550 nm (inclusive)) which is almost equal to the transmittance for the visible light. On the other hand, the neutral density filter has a transmittance of about 10.7% for the infrared light (light having a wavelength of 900 nm) which largely separates to the positive side from the transmittance for the visible light. It is apparent that the neutral density filter shown in FIG. 9 has the tendency of the transmittance to increase to the positive side on the long wavelength side with respect to the visible light, and is very different in wavelength dependence from the neutral density filter shown in FIG. 8.

This embodiment has explained the neutral density filter designed to have a transmittance of 60% and the neutral density filter designed to have a transmittance of 10%. However, there also exist a neutral density filter designed to have a transmittance higher than 60% and a neutral density filter designed to have a transmittance lower than 10%. As described above, since the transmittance characteristics of the neutral density filters arranged on the neutral density filter plate 36 vary, and the dynamic range of the dimming rate is wide, the wavelength dependence is not always uniform.

Therefore, to make, by one light control operation, the light amount of the light for illuminating the alignment mark 19 fall within the light amount range detectable by the photoelectric conversion element 34 (that is, to avoid performing light control again), it is necessary to solve the problem of the wavelength dependence characteristic of the neutral density filter. The reason why the wavelength dependence of the neutral density filter becomes large is that the wavelength band used for the light for illuminating the alignment mark 19 is wide and it is difficult to manufacture a neutral density filter having a uniform transmittance for the wavelength band. It can be considered to provide an illumination optical system for each wavelength band of the light for illuminating the alignment mark 19 and arrange a neutral density filter on the optical path of each illumination optical system. However, this unwantedly leads to complication of the optical system, an increase in size, and an increase in cost. An attempt to improve the uniformity of the transmittance for the wavelength of the neutral density filter leads to an increase in cost of the single neutral density filter. Furthermore, if the wavelength band of light used for alignment is wide, it is difficult to uniform the transmittance for the wavelength of the neutral density filter.

To solve this problem, this embodiment provides a technique capable of implementing a simple optical system in the substrate alignment measurement system 16 and performing light control for light in a wide wavelength band from a blue wavelength to near-infrared wavelength using the neutral density filter without performing light control again.

FIG. 10 is a view showing the relationship between the transmittance of each of neutral density filters ND1 to ND10 managed by the conventional exposure apparatus and an actual transmittance in each of wavelength bands WB1 to WB3. Note that the neutral density filter ND11 has a transmittance of 100%, and indicates that no neutral density filter is actually formed in a filter hole of the turret for complete transmission. In the conventional exposure apparatus, the transmittance of each of the neutral density filters ND1 to ND10 is set to the same value regardless of the wavelength, that is, for all the wavelength bands WB1 to WB3. In the conventional exposure apparatus as well, if the wavelength of the light used for alignment is only in the narrow wavelength bands WB1 to WB3 of the visible light, the transmittance of each of the neutral density filters ND1 to ND10 managed by the exposure apparatus is equal to the actual transmittance in each of the wavelength bands WB1 to WB3. For example, consider a case in which the range of 570 nm (inclusive) to 600 nm (inclusive) is set for the wavelength band WB1, the range of 600 nm (inclusive) to 630 nm (inclusive) is set for the wavelength band WB2, and the range of 570 nm (inclusive) to 630 nm (inclusive) is set for the wavelength band WB3, thereby limiting the wavelength band of the light used for alignment to part of the wavelength band of the visible light. In this case, there is almost no difference between the transmittance of each of the neutral density filters ND1 to ND10 managed by the exposure apparatus and the actual transmittance in each of the wavelength bands WB1 to WB3. Therefore, if the target light amount range (the light amount range detectable by the photoelectric conversion element) of light control is the range of 70% (inclusive) to 90% (inclusive), the light amount can be made to fall within the target light amount range by using (switching) the neutral density filter ND2, ND3, or ND4.

In actual alignment, if the light amount of light from the substrate is measured, and is, for example, 50%, the light amount is small with reference to the target light amount range of 70% (inclusive) to 90% (inclusive), and thus the neutral density filter is switched so that the light amount falls within the target light amount range. Since the light amount of the light from the substrate is not known first, it is necessary to measure the light amount and then switch the neutral density filter so that the light amount falls within the target light amount range.

However, as described above, as the wavelength band of the light used for alignment becomes wider from the blue wavelength to the infrared wavelength, it becomes impossible to maintain the uniformity of the transmittance of the neutral density filter. Therefore, if, like the conventional exposure apparatus, the transmittance of each of the neutral density filters ND1 to ND10 is set to the same value regardless of the wavelength, an error may occur in light control.

FIG. 11 is a view showing the relationship between the transmittance of each of the neutral density filters ND1 to ND10 managed by the conventional exposure apparatus and an actual transmittance in each of wavelength bands WB4 to WB6. For example, a blue wavelength, that is, the range of 450 nm (inclusive) to 550 nm (inclusive) is set for the wavelength band WB4, a visible wavelength, that is, the range of 550 nm (inclusive) to 650 nm (inclusive) is set for the wavelength band WB5, and an infrared wavelength, that is, the range of 570 nm (inclusive) to 630 nm (inclusive) is set for the wavelength band WB6. In this case, it is apparent that the transmittance of each of the neutral density filters ND1 to ND10 managed by the exposure apparatus is not equal to the actual transmittance in each of the wavelength bands WB4 to WB6.

Assume that when the substrate is illuminated with blue wavelength light, and the light amount of light from the substrate is measured via the neutral density filter ND6, a light amount of 48% is obtained. Assume also that the target light amount range of light control is set to the range of 70% (inclusive) to 90% (inclusive), and the neutral density filter ND2 is selected in light control to increase the light amount. In switching from the neutral density filter ND6 to the neutral density filter ND2, a light amount that is 90%/50%=1.8 times is obtained with reference to the transmittance managed by the exposure apparatus, 48%×1.8=86.4% is obtained, and it is thus possible to make the light amount fall within the target light amount range. However, in fact, in switching from the neutral density filter ND6 to the neutral density filter ND2, a light amount that is 92%/48%=1.916 times, 48%×1.916=92% is obtained, and it is impossible to make the light amount fall within the target light amount range, thereby causing an error in light control. To make the light amount fall within the target light amount range, it is necessary to switch the neutral density filter to not the neutral density filter ND2 but the neutral density filter ND3 or ND4. The sequence of selecting the neutral density filter ND2 first and then selecting the neutral density filter ND3 or ND4 is useless, lowering the throughput. If the number of neutral density filters is large and the target light amount range is narrow, no adaptive neutral density filter may be found and light control may be impossible.

Figure 12:
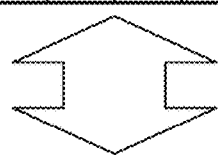
FIG. 12 is a view showing the relationship between an actual transmittance and the transmittance of each neutral density filter managed by the exposure apparatus according to an embodiment.

In this embodiment, the transmittance of the neutral density filter is managed for each wavelength band selectable in the exposure apparatus 100 (substrate alignment measurement system 16). FIG. 12 is a view showing the relationship between the transmittance of each of the neutral density filters ND1 to ND10 managed by the exposure apparatus 100 according to this embodiment and the actual transmittance in each of the wavelength bands WB4 to WB6. For example, assume that the blue wavelength, that is, the range of 450 nm (inclusive) to 550 nm (inclusive) is set for the wavelength band WB4, the visible wavelength, that is, the range of 550 nm (inclusive) to 650 nm (inclusive) is set for the wavelength band WB5, and the infrared wavelength, that is, the range of 570 nm (inclusive) to 630 nm (inclusive) is set for the wavelength band WB6.

In this embodiment, for one neutral density filter, a transmittance is individually set for each of all the wavelength bands selectable in the exposure apparatus 100. In the exposure apparatus 100, the transmittances of the neutral density filters ND1 to ND10 in each of the wavelength bands WB4 to WB6 are obtained and stored in the apparatus. More specifically, the exposure apparatus 100 detects the light amount of light from the reference mark 40 provided on the stage reference plate 11 while changing the combination of each of the neutral density filters ND1 to ND10 and each of the wavelength bands WB4 to WB6. The photoelectric conversion element 34 may detect the light amount of the light from the reference mark 40, or a dedicated sensor that detects the light amount of the light from the reference mark 40 may be provided separately from the photoelectric conversion element 34.

If, for example, the reference mark 40 is illuminated with light in the wavelength band WB4, and the light amount of the light from the reference mark 40 is detected while switching among the neutral density filters ND1 to ND10, the actual transmittance of each of the neutral density filters ND1 to ND10 for the wavelength band WB4 is obtained. Next, if the reference mark 40 is illuminated with light in the wavelength band WB5 and the light amount of the light from the reference mark 40 is detected while switching among the neutral density filters ND1 to ND10, the actual transmittance of each of the neutral density filters ND1 to ND10 for the wavelength band WB5 is obtained. Furthermore, if the reference mark 40 is illuminated with light in the wavelength band WB6, and the light amount of the light from the reference mark 40 is detected while switching among the neutral density filters ND1 to ND10, the actual transmittance of each of the neutral density filters ND1 to ND10 for the wavelength band WB6 is obtained.

Transmittance data representing the thus obtained transmittance of each of the neutral density filters ND1 to ND10 for each of the wavelength bands WB4 to WB6 is stored in, for example, a storage unit 38 of the control unit 17. Based on the transmittance data stored in the storage unit 38, the control unit 17 selects, from the neutral density filters ND1 to ND10, one neutral density filter to be used for light control of the light to be used for illuminating the alignment mark 19. By managing, in the apparatus, the actual transmittance of each neutral density filter for each wavelength band, it is possible to reduce the light intensity in light control at the correct transmittance of the neutral density filter even if light in a wide wavelength band is used for alignment.

In this embodiment, the actual transmittance of each neutral density filter is obtained using the reference mark 40 provided on the stage reference plate 11. However, the present invention is not limited to this. For example, a mark on the substrate may be used as long as the mark is the same as the reference mark. However, if the mark on the substrate is not the same as the reference mark, a difference in light amount between light beams from the marks becomes an error, and thus the same mark as the reference mark is preferably used.

In FIGS. 10, 11, and 12, the transmittance of each of the neutral density filters ND1 to ND10 is in steps of 10%. In fact, however, the transmittance is determined by the neutral density filter provided on the neutral density filter plate 36, and may be set more finely than 10%. Note that in light control, in addition to the use of the neutral density filter, at least one of the output of the light source 20 and the accumulation time of the photoelectric conversion element 34 may be controlled. As described above, at least one of the output of the light source 20 and the accumulation time of the photoelectric conversion element 34 is controlled by the control unit 17. Therefore, the control unit 17 also functions as a light control unit that performs light control of the light that passes through the wavelength filter plate 22 and the neutral density filter plate 36 to illuminate the alignment mark 19.

Figure 13:
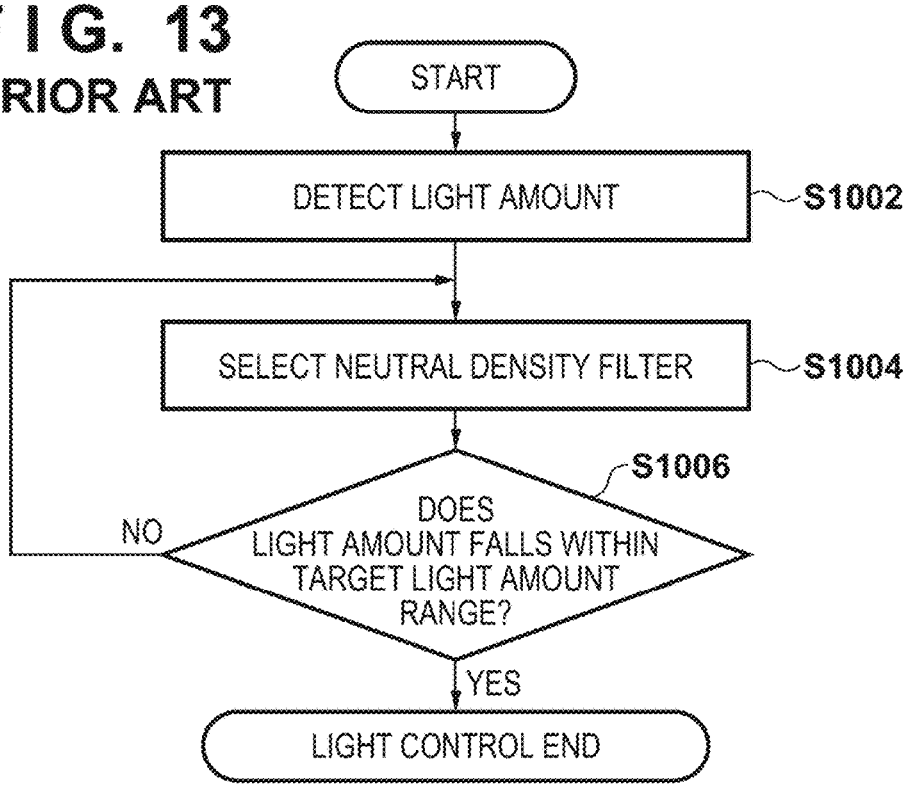
FIG. 13 is a flowchart for explaining light control in the conventional exposure apparatus.

As a comparative example of light control in the exposure apparatus 100 according to this embodiment, light control in the conventional exposure apparatus will be described. FIG. 13 is a flowchart for explaining light control in the conventional exposure apparatus. In step S1002, for example, the light amount of light from the mark provided on the substrate is detected. In step S1004, based on the light amount detected in step S1002 and the transmittance of each neutral density filter managed in the apparatus, the neutral density filter to be used for light control for making the light amount fall within the target light amount range is selected (decided). In step S1006, the neutral density filter selected in step S1004 is arranged on the optical path of the substrate alignment measurement system and it is determined whether the light amount of the light from the mark on the substrate falls within the target light amount range. If the light amount of the light from the mark on the substrate falls outside the target light amount range, the process shifts to step S1004 to reselect the neutral density filter to be used for light control. On the other hand, if the light amount of the light from the mark on the substrate falls within the target light amount range, light control ends.

Each step shown in FIG. 13 will be described in detail with reference to FIG. 11. For example, assume that the neutral density filter ND10 is selected and the light amount of the light from the mark provided on the substrate is 10%. Assuming the target light amount range of 70% to 80%, the light amount needs to increase 7 to 8 times to fall within the target light amount range. To do this, the neutral density filter ND3 that is managed in the apparatus to have a transmittance of 80% is selected. The light amount should increase 8 times (80%/10%) by selecting the neutral density filter ND3. However, in consideration of the actual transmittances of the neutral density filters ND3 and ND10 for the wavelength band WB1, the light amount increases 10.25 times (82%/8%). Therefore, the light amount of 10% increases 10.25 times to be 102.5% which falls outside the target light amount range.

To decrease the light amount, the neutral density filter ND4 is reselected. However, since the actual transmittance of the neutral density filter ND4 for the wavelength band WB1 is 72%, the light amount increases 9 times (72%/8%) which falls outside the target light amount range. Therefore, to further decrease the light amount, the neutral density filter ND5 is reselected. Since the actual transmittance of the neutral density filter ND5 for the wavelength band WB1 is 62%, the light amount increases 7.75 times (62%/8%) which falls within the target light amount range. As described above, in the conventional exposure apparatus, since the transmittances of the neutral density filters managed in the apparatus are different from the actual transmittances, the light amount cannot be made to fall within the target light amount range by one light control operation, and it may be necessary to perform light control again.

Figure 14:
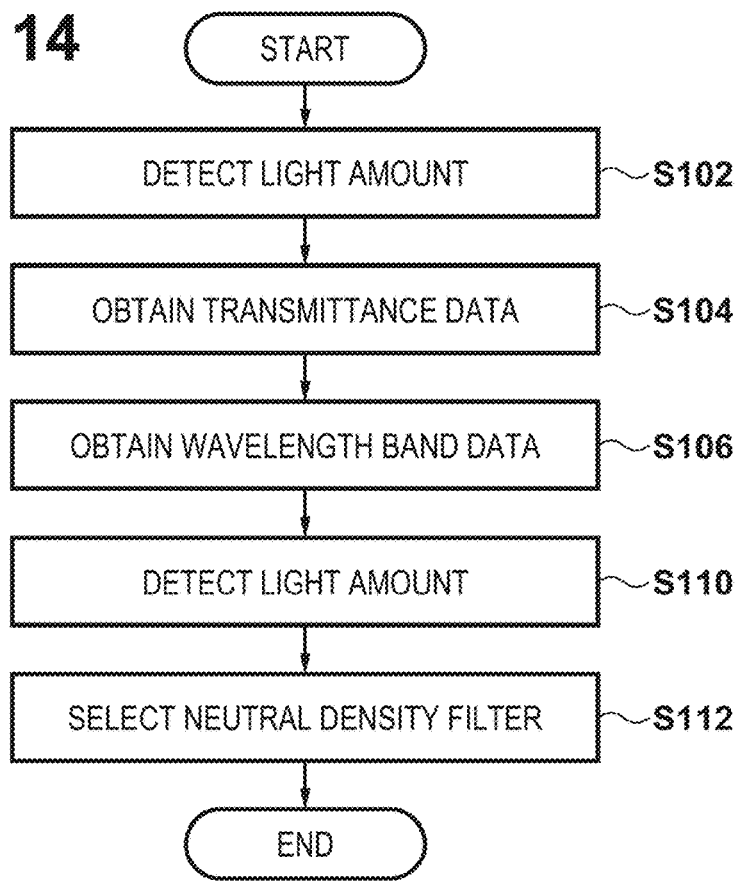
FIG. 14 is a flowchart for explaining light control in the exposure apparatus according to the embodiment.

FIG. 14 is a flowchart for explaining light control in the exposure apparatus 100 according to this embodiment. In step S102, the light amount of the light from the reference mark 40 provided on the stage reference plate 11 is detected while changing the combination of each of the plurality of wavelength filters and each of the plurality of neutral density filters. In step S104, based on the light amount detected in step S102, transmittance data representing the transmittance of each of the plurality of neutral density filters provided on the neutral density filter plate 36 for the wavelength bands of the light beams having passed through the wavelength filters provided on the wavelength filter plate 22 is obtained. As described above, the transmittance data is stored in the storage unit 38 of the control unit 17. In step S106, wavelength band data about the wavelength band of the light to be used for illuminating the alignment mark 19 is obtained (that is, one wavelength filter corresponding to the wavelength band of the light to be used for illuminating the alignment mark 19 is specified). In step S110, the light amount of the light from the alignment mark 19 provided on the substrate 3 is detected. In step S112, the neutral density filter to be used for light control is selected (decided) from the plurality of neutral density filters provided on the neutral density filter plate 36. More specifically, based on the transmittance data obtained in step S104 and the light amount detected in step S110, the neutral density filter to be used for light control for making the light amount of the light in the wavelength band corresponding to the wavelength band data obtained in step S106 fall within the target light amount range is selected.

Each step shown in FIG. 14 will be described in detail with reference to FIG. 12. For example, assume that the neutral density filter ND10 is selected and the light amount of the light from the alignment mark 19 provided on the substrate 3 is 10%. Assuming the target light amount range of 70% to 80%, the light amount needs to increase 7 to 8 times to fall within the target light amount range. Consider a case in which the wavelength band of the light for illuminating the alignment mark 19 is the wavelength band WB4. In this case, with reference to the transmittance data obtained in the exposure apparatus 100, the neutral density filter ND10 has a transmittance of 8% for the wavelength band WB4. Thus, to increase the light amount 7 to 8 times, the neutral density filter ND5 having a transmittance of 62% for the wavelength band WB4 is selected. The light amount increases 7.75 times (62%/8%) to be 77.5% (10%×7.75) by selecting the neutral density filter ND5. As described above, in this embodiment, transmittance data representing the actual transmittance of each neutral density filter for each wavelength band selectable in the exposure apparatus 100 is obtained, and the neutral density filter to be used for light control is selected based on the transmittance data. Therefore, the light amount of the light from the alignment mark 19 can be made to fall within the target light amount range by one light control operation.

In this embodiment, transmittance data representing the actual transmittance of each neutral density filter for each wavelength band selectable in the exposure apparatus 100 is obtained. However, the present invention is not limited to this. For example, if wavelength band data is obtained before transmittance data is obtained, transmittance data representing the transmittance of each neutral density filter not for each wavelength band selectable in the exposure apparatus 100 but for a wavelength band corresponding to the wavelength band data may be obtained. This can shorten the time taken to obtain transmittance data.

This embodiment has exemplified the neutral density filter plate 36 including the turret 362 and the neutral density filters 364a to 364f each formed by a film including a metal layer. However, the present invention is not limited to this. For example, the neutral density filter plate 36 can be replaced by a neutral density filter plate 43 shown in FIG. 15. The neutral density filter plate 43 includes a turret 432 and neutral density filters 434a to 434d arranged on the turret 432 and formed by mechanical meshes having different aperture ratios. By forming the neutral density filters 434a to 434d by mechanical meshes with different thicknesses and pitches of the mesh lines, the restriction ratios of the light amounts of the light beams respectively passing through the neutral density filters 434a to 434d can be changed.

Figure 15:
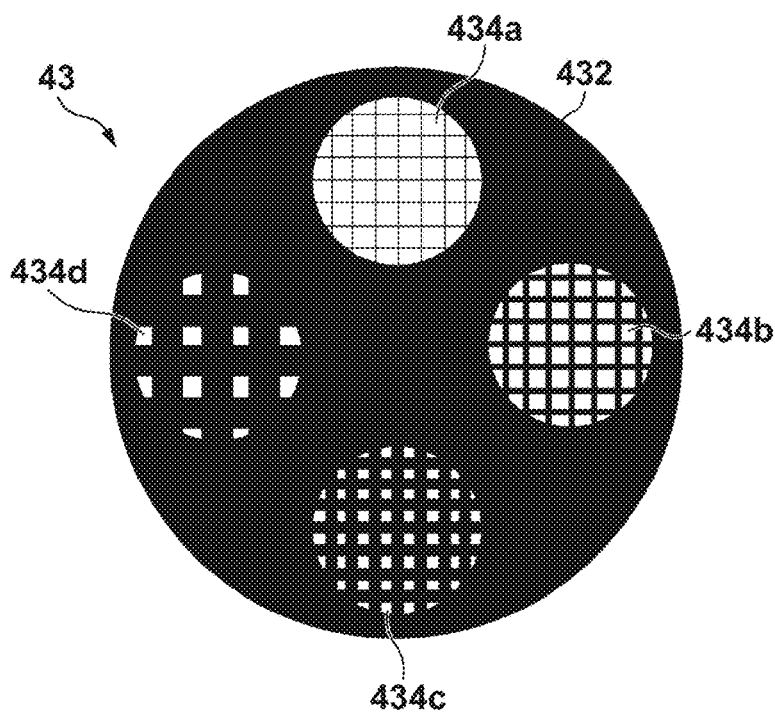
FIG. 15 is a view showing an example of the arrangement of a neutral density filter plate.

In the neutral density filter plate 43 shown in FIG. 15, diffracted light beams of the light beams respectively passing through the neutral density filters 434a to 434d are generated by the pitches of the mesh lines of the mechanical meshes forming the neutral density filters 434a to 434d. Since the diffraction angles of the diffracted light beams change in accordance with the wavelengths of the light beams passing through the neutral density filters 434a to 434d, if the diffraction angles are large, the light beams having passed through the neutral density filters 434a to 434d may not be captured by an optical system at the subsequent stage of the neutral density filter plate 43. Since, in the neutral density filter formed by the mechanical mesh, not only a simple area ratio but also the diffraction angle by the pitch is influenced by the wavelength, and there is a relationship with a capturing angle of the optical system at the subsequent stage, it is difficult to uniform the transmittance for each wavelength band. Therefore, it is very effective to obtain transmittance data representing the actual transmittance of each neutral density filter for each wavelength band selectable in the exposure apparatus 100, and select, based on the transmittance data, the neutral density filter to be used for light control.

Figure 16:
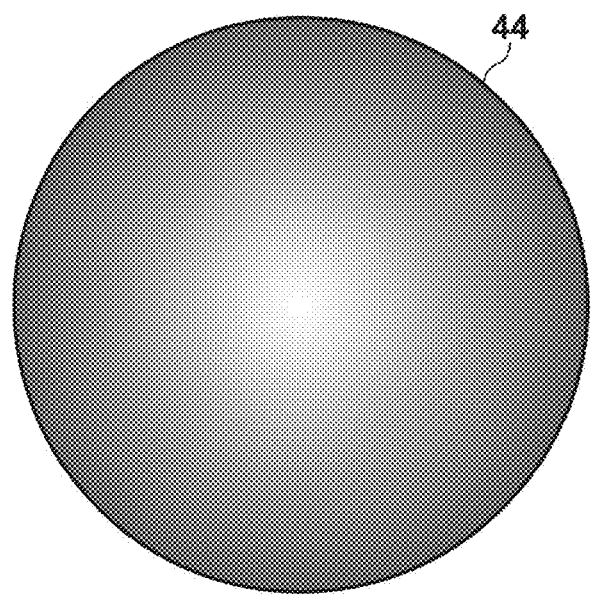
FIG. 16 is a view showing an example of the arrangement of a neutral density filter.

Furthermore, the neutral density filter plate 36 can be replaced by a gradation neutral density filter 44 shown in FIG. 16. Since the neutral density filter 44 is formed by continuously connecting filter regions having different transmittances, the transmittance changes depending on a light incident position. Therefore, by controlling the position of the neutral density filter 44 for incident light, the transmittance of the neutral density filter 44 can be adjusted. The neutral density filter 44 shown in FIG. 16 is, for example, a neutral density filter whose transmittance at the center is high and whose transmittance continuously decreases toward the periphery. Therefore, when it is desirable to obtain a high transmittance, the neutral density filter 44 is positioned so that light enters near the center of the neutral density filter 44.

It is difficult for the neutral density filter 44 shown in FIG. 16 to implement a uniform transmittance for a wide wavelength band from the blue wavelength to the infrared wavelength. Therefore, it is very effective to obtain transmittance data representing the actual transmittance of each neutral density filter for each wavelength band selectable in the exposure apparatus 100, and select, based on the transmittance data, the neutral density filter to be used for light control.

Figure 17:
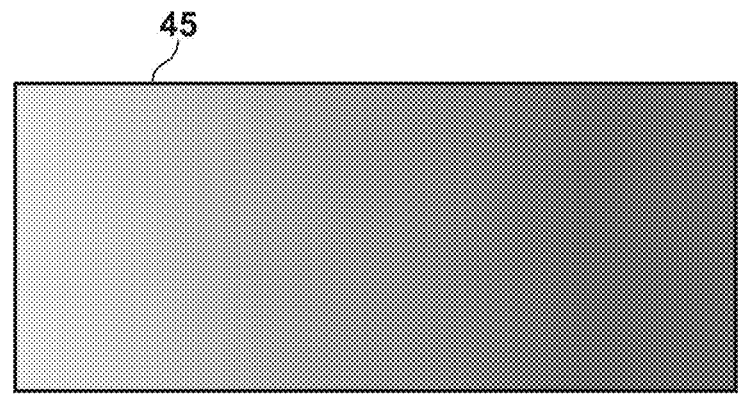
FIG. 17 is a view showing an example of the arrangement of a neutral density filter.

There are various forms of gradation neutral density filters. For example, there exists a neutral density filter whose transmittance continuously changes in a rotation direction, and a neutral density filter 45 whose transmittance continuously changes from one end of a rectangle to the other end, as shown in FIG. 17. Such gradation neutral density filter is also applicable as the neutral density filter plate 36.

A method of manufacturing an article according to the embodiment of the present invention is preferable to manufacture an article such as a device (semiconductor device, magnetic storage medium, liquid crystal display element, or the like), color filter, optical component, or MEMS. This method of manufacturing includes a step of exposing a substrate coated with a photosensitive agent by using the exposure apparatus 100 according to the above-described embodiment and a step of developing the exposed photosensitive agent. An etching step and an ion implantation step are performed for the substrate using the pattern of the developed photosensitive agent as a mask, thereby forming a circuit pattern on the substrate. By repeating the steps such as the exposure, development, and etching steps, a circuit pattern formed from a plurality of layers is formed on the substrate. In a post-step, dicing (processing) is performed for the substrate on which the circuit pattern has been formed, and mounting, bonding, and inspection steps of a chip are performed. The method of manufacturing can further include other known steps (oxidation, deposition, vapor deposition, doping, planarization, resist removal, and the like). The method of manufacturing the article according to this embodiment is superior to the conventional method in at least one of the performance, quality, productivity, and production cost of the article.

According to this embodiment, the exposure apparatus 100 obtains transmittance data of each neutral density filter by detecting the light amount of the light from the reference mark 40. However, the control unit 17 may obtain transmittance data obtained by an external measurement apparatus or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-090109 filed on May 8, 2018, which is hereby incorporated by reference herein in its entirety.

What is claimed is:

1. A measurement apparatus for measuring a position of a substrate by detecting a mark on the substrate, comprising:
a first filter unit including a plurality of first filters arranged on an optical path between a light source configured to output light for illuminating the mark and an image sensor configured to capture the mark, each filter of the plurality of first filters being configured to allow light having a different wavelength band to pass;
a second filter unit including a plurality of second filters arranged on the optical path between the light source and the image sensor, and each filter of the plurality of second filters configured to reduce light intensity of light and allow the light to pass;
an obtaining unit configured to obtain data identifying a transmittance of each filter of the plurality of second filters for a wavelength band of light having passed through each filter of the plurality of first filters; and
a selection unit configured to select, based on the data obtained by the obtaining unit, from the plurality of second filters, one second filter arranged on the optical path together with one first filter among the plurality of first filters.

2. The apparatus according to claim 1, wherein the selection unit is configured to select, from the plurality of first filters, the one first filter corresponding to a wavelength band of light to be used for illuminating the mark.

3. The apparatus according to claim 1, wherein the selection unit is configured to select the one second filter so that the light amount of the light that passes through the one second filter to illuminate the mark falls within a light amount range detectable by the image sensor.

4. The apparatus according to claim 1, wherein the obtaining unit is configured to obtain the data before measuring the position of the substrate.

5. The apparatus according to claim 1, wherein the first filter unit includes the plurality of first filters so as to select a wavelength band of the light for illuminating the mark within a range of 400 nm (inclusive) to 1,200 nm (inclusive).

6. The apparatus according to claim 1, wherein a width of a wavelength band of light passing through each filter of the plurality of first filters falls within a range of 100 nm (inclusive) to 150 nm (inclusive).

7. The apparatus according to claim 1, further comprising a light control unit configured to perform light control of light having passed through the one first filter by controlling an output of the light source, an accumulation time of the image sensor, or both the output of the light source and the accumulation time of the image sensor.

8. The apparatus according to claim 1, wherein each filter of the plurality of second filters is formed by a filter including a metal layer.

9. The apparatus according to claim 1, wherein the plurality of second filters are formed by meshes having different aperture ratios.

10. The apparatus according to claim 1, wherein the plurality of second filters are provided by being continuously connected to each other.

11. The apparatus according to claim 1, further comprising:
a first driving unit configured to drive the first filter unit so as to selectively arrange, on the optical path, one first filter among the plurality of first filters;
a second driving unit configured to drive the second filter unit so as to selectively arrange, on the optical path, one second filter among the plurality of second filters; and
a control unit configured to, based on an input signal, control the first driving unit so as to arrange the one first filter on the optical path and control the second driving unit so as to arrange, on the optical path, the one second filter selected by the selection unit.

12. The apparatus according to claim 1, further comprising a calculation unit configured to obtain the position of the substrate based on an output signal from the image sensor.

13. A measurement apparatus for measuring a position of a substrate by detecting a mark on the substrate, comprising:
a reference mark arranged on a surface on which the substrate is arranged;
a sensor configured to detect a light amount;
a filter unit including a plurality of second filters arranged on an optical path between a light source configured to output light for illuminating the mark and an image sensor configured to capture the mark, each filter of the plurality of second filters being configured to reduce light intensity of light and allow the light to pass; and
a selection unit configured to obtain data identifying a transmittance of each filter of the plurality of second filters for a wavelength band of light to be used for illuminating the mark, and select, based on the data, from the plurality of second filters, one second filter to be used for light control of the light for illuminating the mark,
wherein the selection unit is configured to obtain the data by illuminating, while changing a combination of: (a) each filter of a plurality of first filters to change a band of a plurality of wavelength bands of light to illuminate the reference mark, and (b) each filter of the plurality of second filters, the reference mark with light having passed through each filter of the plurality of second filters, and by detecting a light amount of light from the reference mark by the sensor.

14. An exposure apparatus comprising:
a projection optical system configured to project a pattern of a reticle onto a substrate;
a stage configured to hold the substrate;
a measurement apparatus configured to measure a position of the substrate by detecting a mark on the substrate; and
a control unit configured to control a position of the stage based on a measurement result of the measurement apparatus,
the measurement apparatus comprising:
a first filter unit including a plurality of first filters arranged on an optical path between a light source configured to output light for illuminating the mark and an image sensor configured to capture the mark, each filter of the plurality of first filters being configured to allow light having a different wavelength band to pass,
a second filter unit including a plurality of second filters arranged on the optical path between the light source and the image sensor, and each filter of the plurality of second filters configured to reduce light intensity of light and allow the light to pass,
an obtaining unit configured to obtain data identifying a transmittance of each filter of the plurality of second filters for a wavelength band of light having passed through each filter of the plurality of first filters, and
a selection unit configured to select, based on the data obtained by the obtaining unit, from the plurality of second filters, one second filter arranged on the optical path together with one first filter among the plurality of first filters.

15. An exposure apparatus comprising:
a projection optical system configured to project a pattern of a reticle onto a substrate;
a stage configured to hold the substrate;
a measurement apparatus configured to measure a position of the substrate by detecting a mark on the substrate; and
a control unit configured to control a position of the stage based on a measurement result of the measurement apparatus, the measurement apparatus comprising:
a reference mark arranged on a surface on which the substrate is arranged;
a sensor configured to detect a light amount;
a filter unit including a plurality of second filters arranged on an optical path between a light source configured to output light for illuminating the mark and an image sensor configured to capture the mark, each filter of the plurality of second filters being configured to reduce light intensity of light and allow the light to pass, and
a selection unit configured to obtain data identifying a transmittance of each filter of the plurality of second filters for a wavelength band of light to be used for illuminating the mark, and select, based on the data, from the plurality of second filters, one second filter to be used for light control of the light for illuminating the mark,
wherein the selection unit is configured to obtain the data by illuminating, while changing a combination of: (a) each filter of a plurality of first filters to change a band of a plurality of wavelength bands of light to illuminate the reference mark, and (b) each filter of the plurality of second filters, the reference mark with light having passed through each filter of the plurality of second filters, and by detecting a light amount of light from the reference mark by the sensor.

16. A method of manufacturing an article, the method comprising:
exposing a substrate using an exposure apparatus,
developing the exposed substrate; and
manufacturing the article from the developed substrate,
wherein the exposure apparatus includes:
a projection optical system configured to project a pattern of a reticle onto the substrate,
a stage configured to hold the substrate,
a measurement apparatus configured to measure a position of the substrate by detecting a mark on the substrate, and
a control unit configured to control a position of the stage based on a measurement result of the measurement apparatus, and
wherein the measurement apparatus includes:
a first filter unit including a plurality of first filters arranged on an optical path between a light source configured to output light for illuminating the mark and an image sensor configured to capture the mark, each filter of the plurality of first filters being configured to allow light having a different wavelength band to pass, a second filter unit including a plurality of second filters arranged on the optical path between the light source and the image sensor, and each filter of the plurality of second filters configured to reduce light intensity of light and allow the light to pass, an obtaining unit configured to obtain data identifying a transmittance of each filter of the plurality of second filters for a wavelength band of light having passed through each filter of the plurality of first filters, and a selection unit configured to select, based on the data obtained by the obtaining unit, from the plurality of second filters, one second filter arranged on the optical path together with one first filter among the plurality of first filters.

17. A method of manufacturing an article, the method comprising:

exposing a substrate using an exposure apparatus,
developing the exposed substrate; and
manufacturing the article from the developed substrate,
wherein the exposure apparatus includes:
a projection optical system configured to project a pattern of a reticle onto the substrate,
a stage configured to hold the substrate,
a measurement apparatus configured to measure a position of the substrate by detecting a mark on the substrate, and
a control unit configured to control a position of the stage based on a measurement result of the measurement apparatus, and wherein the measurement apparatus includes:
a reference mark arranged on a surface on which the substrate is arranged;
a sensor configured to detect a light amount;
a filter unit including a plurality of second filters arranged on an optical path between a light source configured to output light for illuminating the mark and an image sensor configured to capture the mark, each filter of the plurality of second filters being configured to reduce light intensity of light and allow the light to pass, and
a selection unit configured to obtain data identifying a transmittance of each filter of the plurality of second filters for a wavelength band of light to be used for illuminating the mark, and select, based on the data, from the plurality of second filters, one second filter to be used for light control of the light for illuminating the mark,
wherein the selection unit is configured to obtain the data by illuminating, while changing a combination of: (a) each filter of a plurality of first filters to change a band of a plurality of wavelength bands of light to illuminate the reference mark, and (b) each filter of the plurality of second filters, the reference mark with light having passed through each filter of the plurality of second filters, and detecting a light amount of light from the reference mark by the sensor.

18. A measurement apparatus for measuring a position of a substrate by detecting a mark on the substrate, comprising:

a first filter unit including a plurality of first filters arranged on an optical path between a light source configured to output light for illuminating the mark and an image sensor configured to capture the mark, each filter of the plurality of first filters being configured to allow light having a different wavelength band to pass;

a second filter unit including a plurality of second filters arranged on the optical path between the light source and the image sensor, and each filter of the plurality of second filters configured to reduce light intensity of light and allow the light to pass;

an obtaining unit configured to obtain data representing a transmittance of each filter of the plurality of second filters for a wavelength band of light having passed through each filter of the plurality of first filters;

a selection unit configured to select, based on the data obtained by the obtaining unit, from the plurality of second filters, one second filter arranged on the optical path together with one first filter among the plurality of first filters;

a reference mark arranged on a surface on which the substrate is arranged; and a sensor configured to detect a light amount, wherein the obtaining unit is configured to obtain the data by illuminating, while changing a combination of each filter of the plurality of first filters and each filter of the plurality of second filters, the reference mark with light having passed through a first filter and a second filter of the combination, and detecting a light amount of light from the reference mark by the sensor.

* * * * *